United States Patent
Chen

(10) Patent No.: US 7,352,574 B2
(45) Date of Patent: Apr. 1, 2008

(54) ASSEMBLY AND HEAT-DISSIPATING DEVICE HAVING THE SAME ASSEMBLY

(75) Inventor: Jui-Lin Chen, Taipei (TW)

(73) Assignee: Inventec Corporation (TW)

( * ) Notice: Subject to any disclaimer, the term of this patent is extended or adjusted under 35 U.S.C. 154(b) by 60 days.

(21) Appl. No.: 11/363,656

(22) Filed: Feb. 27, 2006

(65) Prior Publication Data

US 2006/0279929 A1  Dec. 14, 2006

(30) Foreign Application Priority Data

Jun. 14, 2005  (TW) ............................... 94209908 U

(51) Int. Cl.
*H05K 7/20* (2006.01)

(52) U.S. Cl. ...................... 361/695; 361/690; 361/694; 165/104.34; 165/121; 415/213.1; 416/246

(58) Field of Classification Search ................ 361/687, 361/692–697, 715, 719, 724–727, 831; 165/80.3, 165/165, 185, 121–126; 174/15.1, 15.2, 174/16.3, 252; 415/213.1, 214.1; 417/423.15, 417/423.14; 454/184; 439/61, 296–298, 439/487
See application file for complete search history.

(56) References Cited

U.S. PATENT DOCUMENTS

| | | | | |
|---|---|---|---|---|
| 4,834,615 | A  * | 5/1989 | Mauch et al. ............. | 415/213.1 |
| 6,213,819 | B1 * | 4/2001 | Fan ........................... | 439/894 |
| 6,244,953 | B1 * | 6/2001 | Dugan et al. ............... | 454/184 |
| 6,808,411 | B2 * | 10/2004 | Chen ......................... | 439/485 |
| 6,817,939 | B2 * | 11/2004 | Gan et al. .................. | 454/184 |
| 6,826,048 | B1 * | 11/2004 | Dean et al. ................. | 361/695 |
| 6,999,313 | B2 * | 2/2006 | Shih .......................... | 361/695 |
| 7,145,771 | B2 * | 12/2006 | Wang ........................ | 361/695 |
| 7,230,826 | B2 * | 6/2007 | Kyle et al. .................. | 361/695 |

* cited by examiner

*Primary Examiner*—Michael Datskovskiy
(74) *Attorney, Agent, or Firm*—Peter F. Corless; Steven M. Jensen; Edwards Angell Palmer & Dodge LLP

(57) ABSTRACT

An assembly and a heat-dissipating device having the same assembly are provided, in that tapped holes in fans of the heat-dissipating device are used with at least two columnar first fixing parts for mounting or detaching the heat-dissipating device with the need for extra tools. Accordingly, problems in the prior art may be solved.

8 Claims, 5 Drawing Sheets

ASSEMBLY AND HEAT-DISSIPATING DEVICE HAVING THE SAME ASSEMBLY

FIELD OF THE INVENTION

The present invention relates to a bonding technique of a heat-dissipating device, and in particular to an assembly and a heat-dissipating device having the same assembly.

BACKGROUND OF THE INVENTION

With the increase of operating performance of electronic devices such as computers or servers having CPUs (Central Process Units) in progressive technology, the amount of heat incident to this increase in performance is becoming larger and larger. Moreover, one must pay more attention to temperature control because of raised clock rate of recent CPUs. Therefore, it is important to avoid abnormal operations or even failure in systems resulted from high temperature. In order solve the problem of heat dissipation; fans are applied to guide airflow along specific channels for dissipation.

Traditionally, a fan is mounted inside the casing of an electronic device such as a computer or a server. However, as the heat generated becomes larger, a plurality of heat-dissipating devices (e.g. fans) are generally required. Meanwhile, fans may need to be replaced after operating for some time due to damage, so fans are generally mounted in a casing of an electronic device with detachable means.

The common mounting method is to fix a fan in a casing of an electronic device with fasteners such as bolts. However, in this method, to mount or demount a fan, a tool such as a screwdriver must be used, causing inconvenience.

At the same time, a heat-dissipating device such as a fan of an electronic device such as a server is usually connected to a fan duct. If the fan is fixed according to aforementioned method, several corresponding tapped holes should be provided on the fan duct. Accordingly, it is not only time consuming in mounting, but also complicated in manufacturing, and it may also damage the stable structure of the fan duct and/or the heat-dissipating device (i.e. fan).

In order to solve the above problems, a plurality of fans are usually first fastened to a fixed structure, and then the fixed structure is combined with the fan duct. As shown in FIG. 1, a plurality of first tapped holes 101, a second tapped hole 103 and a plurality of vents 105 are provided on a fixed structure 10. The first tapped holes 101 corresponding to through holes 201 of fans 20 (only one fan is shown herein) are disposed on a surface of the fixed structure 10. The second tapped hole 103 corresponding to a through hole 301 of a fan duct 30 is disposed on the extending side which is vertical to said surface of the fixed structure 10. The vents 105 corresponding to vents 203 of the fans 20 are provided on the surface of the fixed structure 10.

When the fans 20 are to be mounted in the casing of an electronic device, firstly, a plurality of fasteners 40 penetrate through the first tapped holes 101 of the fixed structure 10 and the through holes 201 of the fans 20, so that the fixed structure 10 and the fans 20 can be fixed with each other; then another fastener 40 penetrates through the second tapped hole 103 of the fixed structure 10 which is now mounted with the fans 20 and the through hole 301 of the fan duct 30, so that the fixed structure 10 and the fan duct 30 can be fixed with each other. Accordingly, the fans 20 can be fixed to the fan duct 30 via the fixed structure 10, so the fans 20 can be mounted inside the casing of the electronic device for dissipating heat, and the fixed structure 10 can ensure airflow are guided to the predetermined areas.

Although the problems of a complicated manufacturing process and damage of the stable structures of the fan duct and/or the heat-dissipating devices (i.e. fans) may be avoided, but the same problems are transferred to the design of the fixed structure. For example, a plurality of tapped holes provided on the fan duct before must now be provided on the surface of the fixed structure. Additionally, fastening strength between the fan duct and the fixed structure is weak.

Meanwhile, a tool such as a screwdriver is still needed in this prior technique. Even if one heat-dissipating device is replaced, the fixing structure must be separated from the fan duct before the heat-dissipating device can be replaced. Accordingly, it is still not convenient for mounting or demounting.

Moreover, if a portion of the fixed structure is damaged, the entire fixed structure must be replaced. Waste of material consumption may exist besides time and power. Therefore, there exist many deficiencies to be solved in such prior art.

As a result, there is a need for developing a heat-dissipating device which can be mounted or demounted quickly without tools, so that the various aforementioned defects of the prior art can be solved.

SUMMARY OF THE INVENTION

In light of the abovementioned defects of the prior art, it is the primary objective of the present invention to provide an assembly and a heat-dissipating device having the same assembly which can be mounted or demounted without tools.

It is another objective of the present invention to provide an assembly and a heat-dissipating device having the same assembly which can be mounted or demounted quickly.

It is further objective of the present invention to provide an assembly and a heat-dissipating device having the same assembly which can reduce materials used.

It is another objective of the present invention to provide an assembly and a heat-dissipating device having the same assembly which can reduce elements required.

It is still another objective of the present invention to provide an assembly and a heat-dissipating device having the same assembly which can raise the design flexibility.

In order to attain these and other objects disclosed above, an assembly and a heat-dissipating device having the same assembly are provided according to the present invention.

The assembly comprises a ventilative structure, a plurality of fastening parts which are disposed around the ventilative structure and an elastic part which horizontally extends from the lower side of the ventilative structure. Preferably, the assembly is made of elastic material, wherein the elastic material may be polycarbonate (PC). The fastening parts are through holes. The elastic part can be an elastic sheet. The elastic part includes a through hole. The elastic part is a buckling and upwardly extending structure.

The heat-dissipating device comprises a fan and an assembly. Preferably, the assembly is assembled to one side of the fan and comprises a ventilative structure, a plurality of fastening parts which are disposed around the ventilative structure and an elastic part which horizontally extends from the lower side of the ventilative structure, wherein the fan includes a plurality of tapped holes corresponding to the fastening parts. The fastening parts are preferably through holes. The assembly may be integrally formed with the fan.

Compared with the prior art that a fan is fixed in a casing of an electronic device by fasteners such as bolts to result in defects that is not only time consuming in mounting but also complicated in manufacturing and also damage the stable structures of fan duct and/or heat-dissipating devices (fans), the present invention uses at least two columnar first fixing parts and tapped holes of the heat-dissipating device to mount or detach the heat-dissipating device without tools. Accordingly, it is convenient for user to mount or demount the heat-dissipating device quickly.

Meanwhile, the present invention can be used to avoid the problems of the prior art such as complication in manufacturing and damage of the stable structures of fan duct and/or heat-dissipating devices (fans), and the same aforementioned problems transferred to the fixed structure. Furthermore, the assembly and the heat-dissipating device having the same assembly of the present invention are provided to reduce material and elements required. In addition, the present invention may be applied in the present or new product design, which raises design flexibility.

As a result, the assembly and the heat-dissipating device having the assembly of the present invention can solve various deficiencies of the prior art. Therefore, the heat-dissipating device can be mounted or demounted quickly without tools, material and elements used can be reduced, and the design flexibility can also be raised.

DISCLOSURE OF THE INVENTION

The following embodiments are described in detail to illustrate the present invention, but they are not limited to the scope of the present invention.

Figure 1:
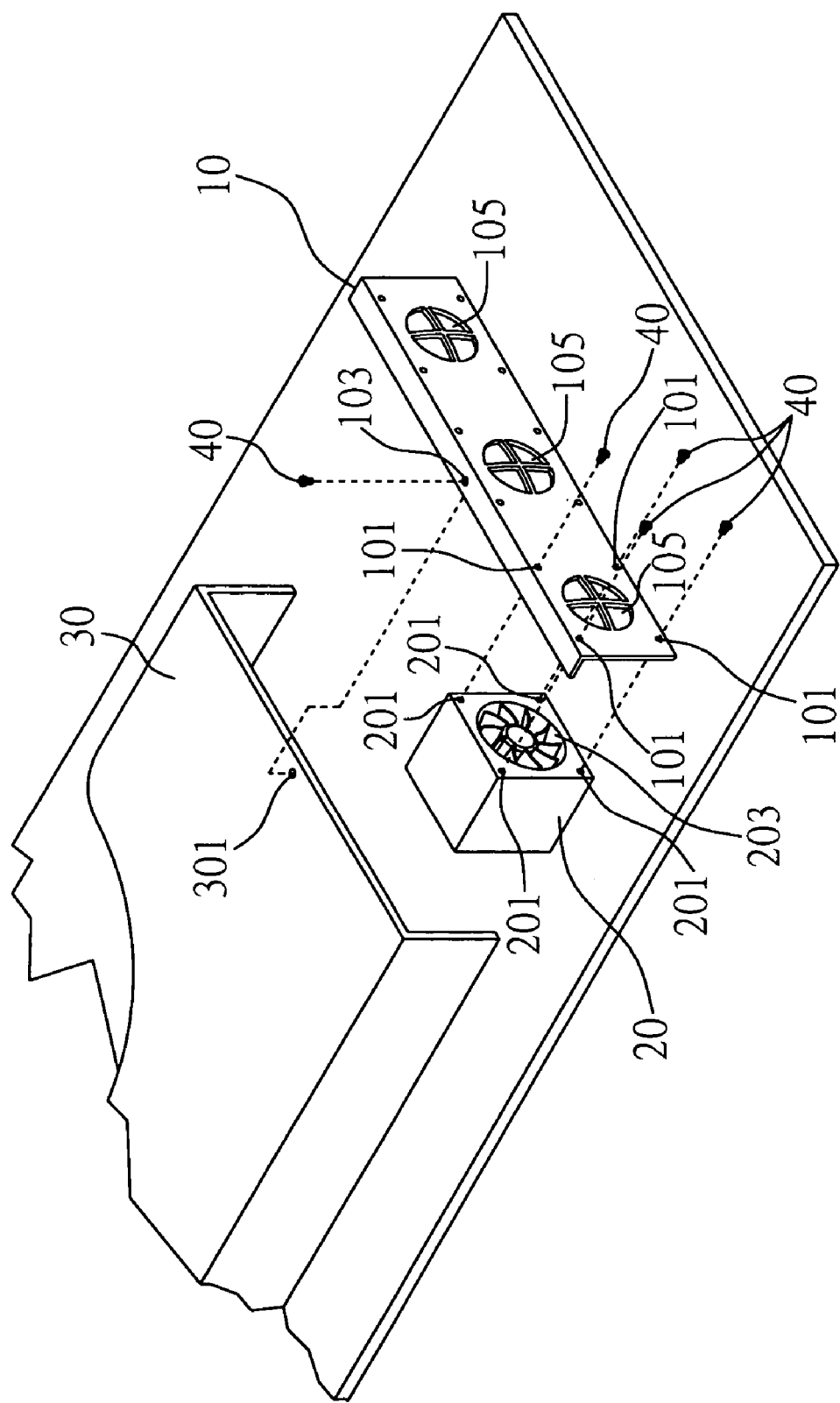
FIG. 1 is a cross-sectional view showing a fixed structure of the prior art.
Figure 2:
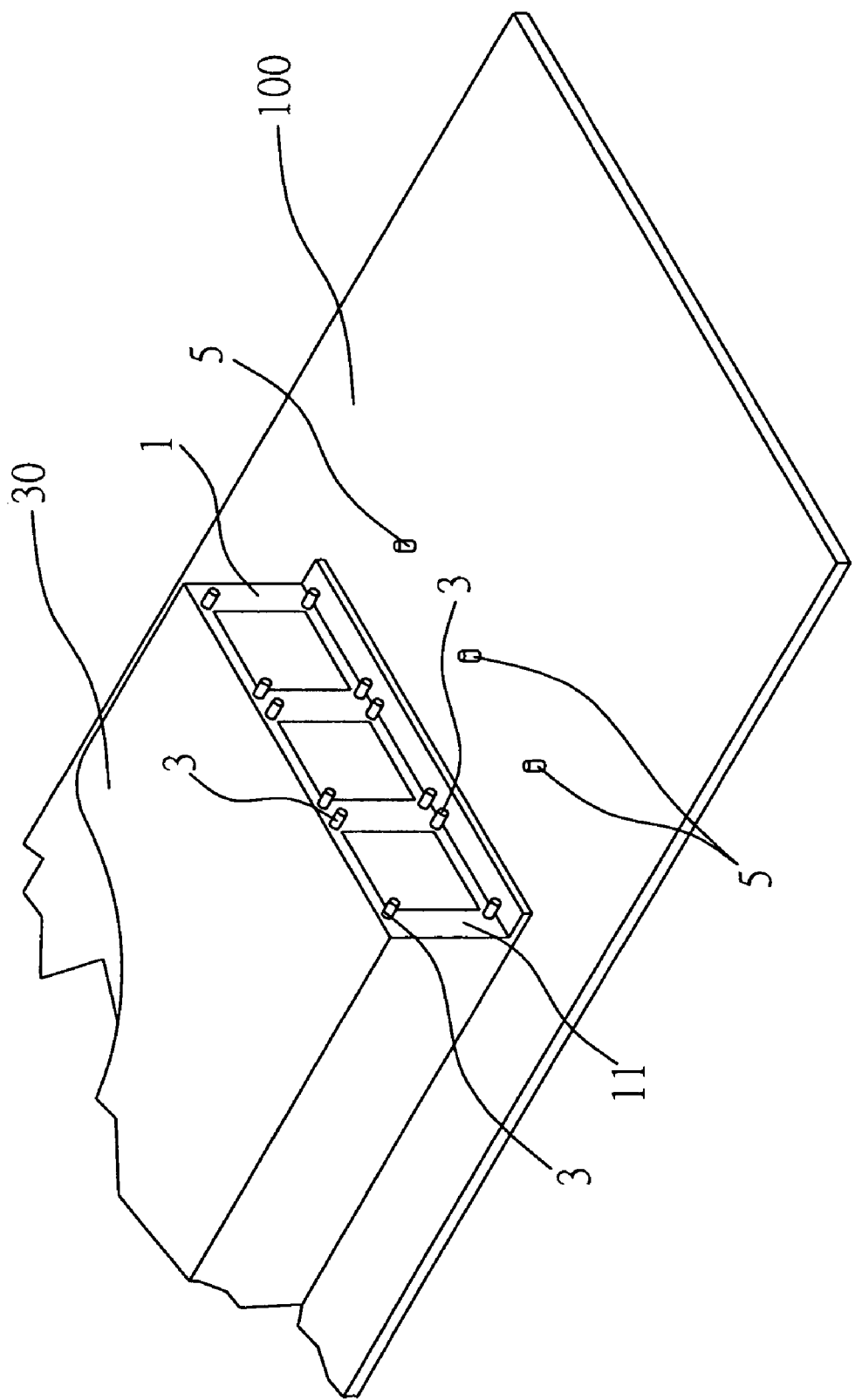
FIG. 2 is a cross-sectional view showing a preferred embodiment of a fixed structure according to the present invention.

FIGS. 2 to 6 are cross-sectional views showing a preferred embodiment according to the present invention. As shown in FIG. 2, a fixed structure applied in the present invention mainly comprises a protective shield 1, at least two first fixing parts 3, and at least a second fixing part 5. As shown in FIGS. 3A and 3B, a heat-dissipating device includes a fan 20 and an assembly 50.

Figure 3B:
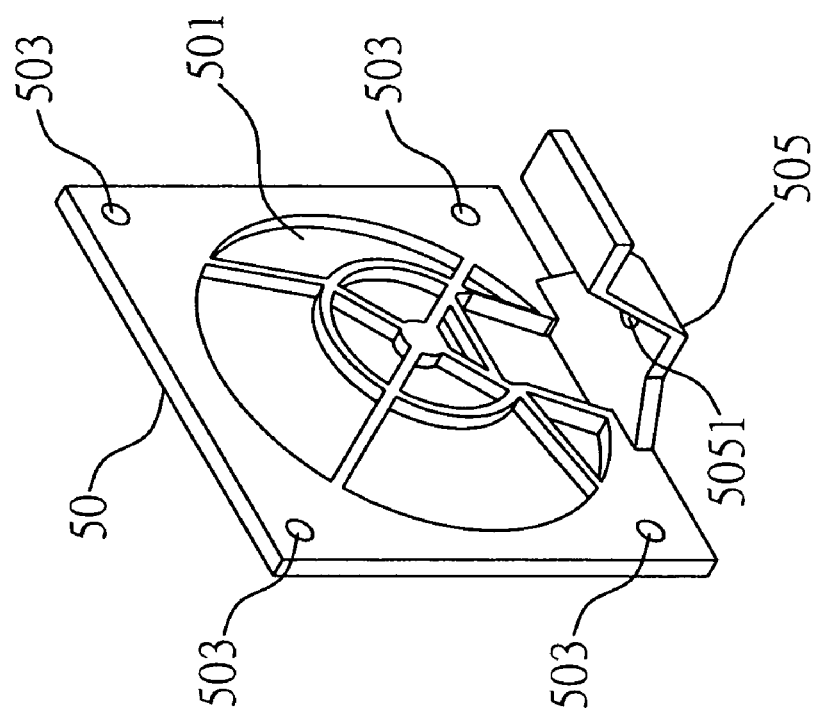
FIG. 3B is a cross-sectional view showing an assembly.
Figure 3A:
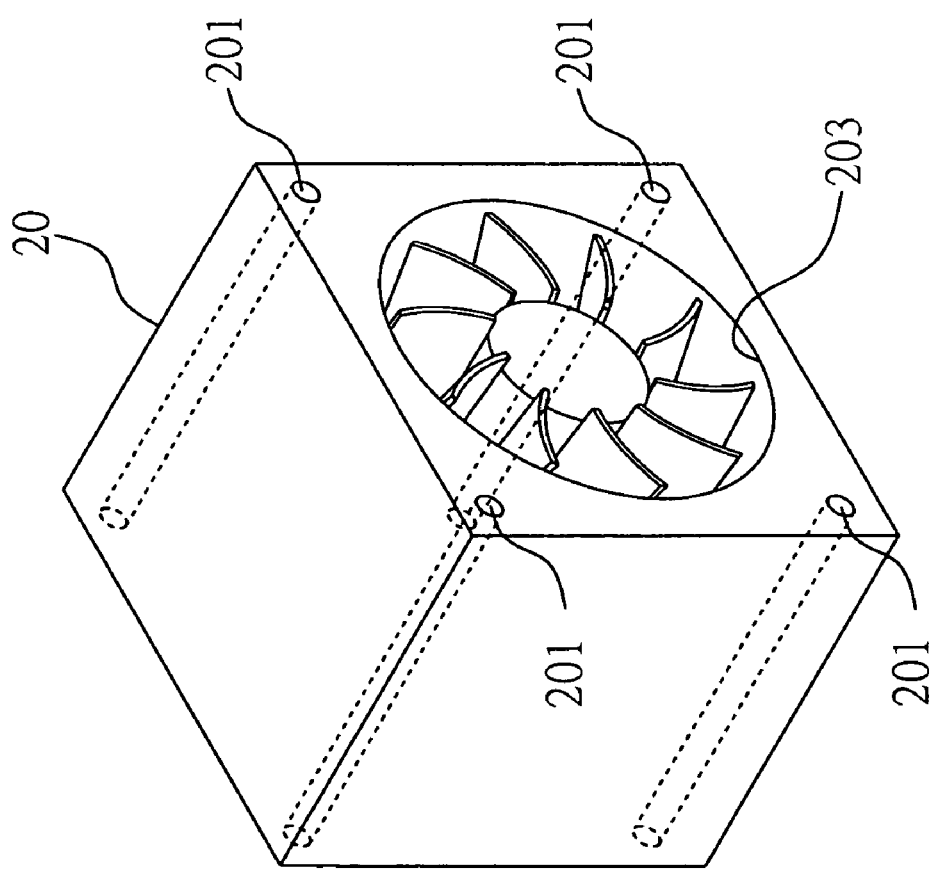
FIG. 3A is a cross-sectional view showing a fan.

It should be noted, the assembly and the heat-dissipating device having the same assembly of the present invention are illustrated by mounting at least one fan 20 with a plurality of through holes shown in FIG. 3A to a fan duct 30 provided on a base 100 of an electronic device, however they are not limited to such illustration. Furthermore, heat-dissipating devices such as fans, the electronic device, the fan duct, the base of the electronic device and the like in the prior art are applicable in the present invention; their structures remain the same. Only those components directly related to the present invention are shown in the drawings while the rest are omitted for the sake of simplicity and clarity. Like or corresponding parts to those shown in the prior art are denoted by like references.

Referring to FIGS. 2 and 3A, the protective shield 1 and the fan duct 30 are integrally formed as one. The protective shield 1 includes at least a limiting part 11 corresponding to a vent 203 of the fan 20. The limiting part 11 can ensure that the air introduced by the fan 20 is flowing to the predetermined areas. For example, three fans 20 mounted to the fan duct 30 are described in this embodiment, but it should be understood the quantity of the fans is not limited to the present invention. Furthermore, only one mounted fan 20 is illustrated herein to simplify the illustration and clarify the features and descriptions of the present invention. Meanwhile, the shape of the limiting part 11 is rectangular corresponding to the casing of the fan 20 in the present embodiment, however it should be understood the shape and size of the limiting part 11 can vary with the casing of the fan 20 so long as to limit the air flowing to the predetermined areas after mounting the fan 20. For example, the limiting part 11 may be provided in an "n" shape, such that the upper side of the fan 20 is in contact with the limiting part 11 and the lower side of the fan 20 is directly in contact with the base 100. Thus, the shape of the limiting part is not limited to that described in this embodiment.

The first fixing parts 3 are disposed on the limiting part 11 and can detachably assemble to at least two through holes 201 on the fan 20 for fixing the fan 20 in a vertical assembling direction. In this embodiment, for example, 4 columnar first fixing parts 3 are disposed at the four corners of the limiting part 11. It should be understood the quantity, the location and the shape of the limiting part 3 are not limited to those above. For example, two, three or more than four first fixing parts 3 can be used; the first fixing parts 3 can be configured in catercorner, symmetrical or unsymmetrical locations, and any structure corresponding to the through holes 201 can be applied in the present invention. Certainly, it is just an example of the present invention, any quantity, location configuration and shape of the first fixing parts 3 can obviously be changed and modified by those with ordinary skill in the art but still within the scope of the present invention.

The second fixing part 5 is disposed on the base 100 for fixing the fan 20 in a horizontal assembling direction. In this embodiment, the second fixing part 5 extends upwards from the surface of the base 100 and the shape of it is columnar. However, it is not limited to the structure of the second fixing part 5 illustrated herein, any structure for fixing the fan 20 in a horizontal direction can be used in the present invention, which will be described in detail as follows.

As shown in FIG. 3B, the assembly 50 comprises a ventilative structure 501, a plurality of fastening parts 503 which are disposed around the ventilative structure 501, and an elastic part 505 which horizontally extends from the lower side of the ventilative structure 501. The fastening parts 503 are through holes, and the elastic part 505 includes a through hole 5051 for assembling to the second fixing part 5 correspondingly. The elastic part 505 may be an elastic sheet and the like. Furthermore, the elastic part 505 may be, for example, a buckling and upwardly extending structure to facilitate easy manipulation of the elastic part 505 for mounting or detaching.

Figure 4:
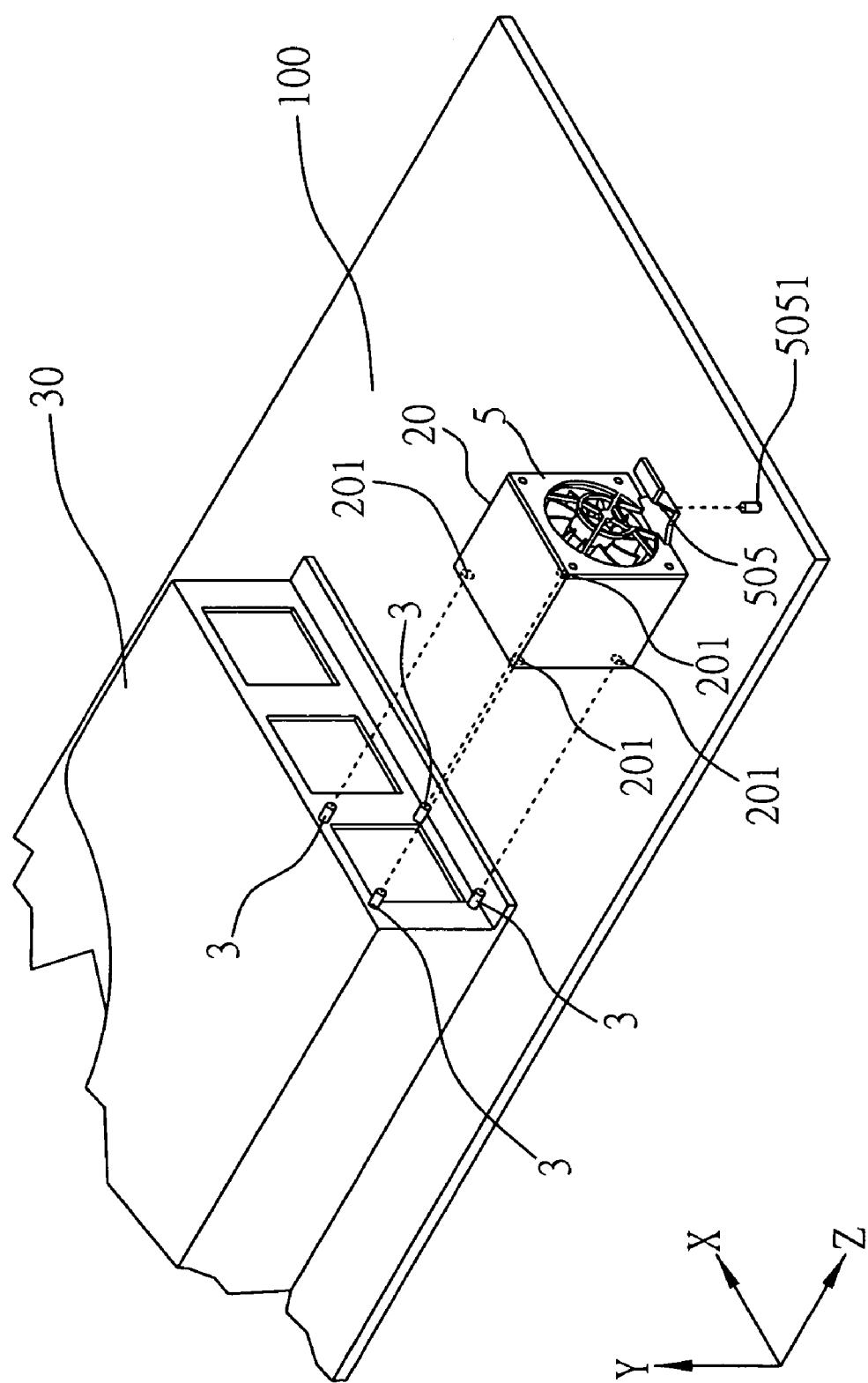
FIG. 4 is an exploded view showing an assembling process of the preferred embodiment according to the present invention.
Figure 5:
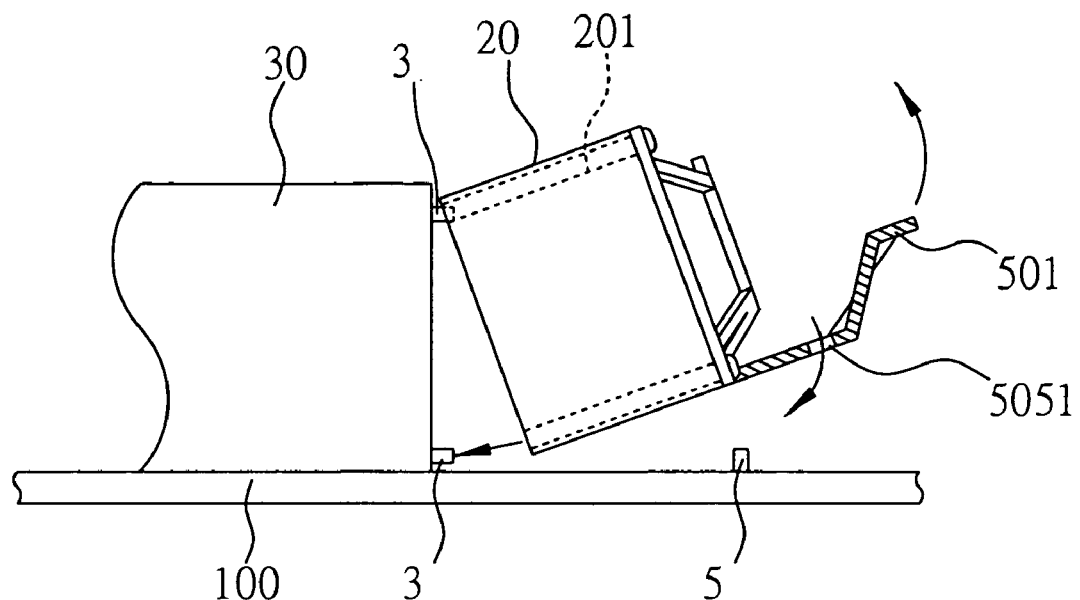
FIG. 5 is a cross-sectional view showing the assembling status of the preferred embodiment according to the present invention.
Figure 6:
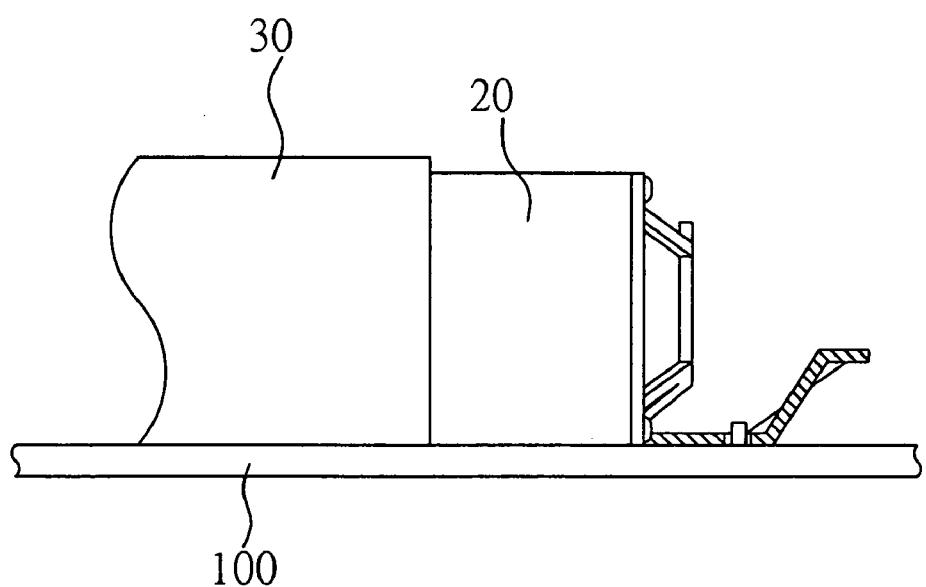
FIG. 6 is a cross-sectional view showing the preferred embodiment of the present invention after assembling.

As shown in FIG. 4, when the fan 20 is to be mounted to the fan duct 30 on the base 100, the assembly 50 is first assembled to the fan 20, and then the first fixing parts 3 are matched to the corresponding through holes 201, respectively, and the second fixing part 5 is matched to the through hole 5051 of the assembly 50. As shown in FIG. 5, the first fixing parts are inserted in the through holes 201, respectively, and then the elastic part 501 is slightly pulled up for inserting the second fixing part 5 to the corresponding through hole 5051. Referring to FIG. 6 in conjunction with FIG. 4, the fan 20 can be fixed firmly to the fan duct 30 and the base 100 not only in vertical direction (i.e. X axis and Y axis) but also in horizontal direction (i.e. Z axis). Moreover, when the fan 20 is to be detached from the base 100 and the fan duct 30, the assembly 50 is separated at first, and then the fan 20 is detached from the fan duct 30.

In this embodiment, the assembly 50 is a separate component for assembling to one side of the fan 20, whereas in other embodiments, the assembly 50 may also be integrated to the fan 20. Alternatively, the structure of the assembly 50 is not limited to the illustrated example. Accordingly, the bolts that fasten the assembly 50 to the fan 20 can also be omitted. Furthermore, it is possible that only the elastic part 505 is made of elastic material, and that the present invention is not limited to the assembling process mentioned above. Thus, it should be understood by those with ordinary skills the art that the present invention is not limited to the illustrated embodiment and variations may be made depending on requirements.

In contrast to the prior art, the heat-dissipating device according to the present invention can be mounted in a casing of an electronic device or demounted from the casing of the electronic device without tools. Therefore, it is easy and quick in mounting or demounting. Moreover, fasteners such as bolts are used to fasten the heat-dissipating device in a casing of an electronic device (for example, an fan duct) in the prior art, whereas these fasteners can be eliminated in the present invention.

In the prior art, it is complicated for manufacturing, storage or management of the heat-dissipating device because of the separate design of the fixed structure, but such problems can be avoided in the present invention. Additionally, only the assembly will be replaced if it is damaged other than replacing the entire fixed structure in the prior art, so the material can be saved. Furthermore, the assembly can be selectively integrated to the heat-dissipating device and the fixing structure for fixing the heat-dissipating device can be selectively integrated to a casing of an electronic device. Accordingly, the present invention can be applied in not only new but also present design of products, so the design flexibility can be raised.

As a result, an assembly and a heat-dissipating device having the same assembly of the present invention can solve various problems of the prior art, wherein the heat-dissipating device can be mounted or demounted quickly without tools, material and required elements can be saved, and the design flexibility can also be raised.

The above embodiments are only used to illustrate the principles of the present invention, and they should not be construed as to limit the present invention in any way. The above embodiments can be modified by those with ordinary skills in the arts without departing from the scope of the present invention as defined in the following appended claims.

What is claimed is:

1. An assembly, comprising:
   a ventilative structure;
   a plurality of fastening parts disposed around said ventilative structure; and
   an elastic part horizontally extending from a lower side of said ventilative structure, said elastic part having a through hole.

2. The assembly of claim 1, wherein said assembly is made of elastic material.

3. The assembly of claim 2, wherein said elastic material is polycarbonate (PC).

4. The assembly of claim 1, wherein said fastening parts are through holes.

5. The assembly of claim 1, wherein said elastic part is a buckling and upwardly extending structure.

6. A heat-dissipating device, comprising:
   a fan; and
   an assembly assembled to a side of said fan and comprising a ventilative structure, a plurality of fastening parts disposed around said ventilative structure and an elastic part horizontally extending from the lower side of said ventilative structure, said elastic part having a through hole.

7. The heat-dissipating device of claim 6, wherein said fan includes a plurality of tapped holes configured correspondingly to said fastening parts.

8. The heat-dissipating device of claim 6, wherein said fastening parts are through holes.

* * * * *